(12) United States Patent
Ahn et al.

(10) Patent No.: US 6,653,208 B2
(45) Date of Patent: *Nov. 25, 2003

(54) WAFER ON WAFER PACKAGING AND METHOD OF FABRICATION FOR FULL-WAFER BURN-IN AND TESTING

(75) Inventors: Kie Y. Ahn, Chappaqua, NY (US); Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/114,558

(22) Filed: Apr. 2, 2002

(65) Prior Publication Data

US 2002/0098619 A1 Jul. 25, 2002

Related U.S. Application Data

(63) Continuation of application No. 09/640,739, filed on Aug. 17, 2000, now Pat. No. 6,379,982.

(51) Int. Cl.$^7$ ................................................ H01L 21/30
(52) U.S. Cl. ........................................ 438/458; 438/14
(58) Field of Search .......................... 438/14, 106, 459, 438/15; 324/765, 754, 755, 760

(56) References Cited

U.S. PATENT DOCUMENTS

| | | |
|---|---|---|
| 4,968,931 A | 11/1990 | Littlebury et al. |
| 5,440,241 A | 8/1995 | King et al. |
| 5,442,282 A | 8/1995 | Rostoker et al. |
| 5,541,524 A | 7/1996 | Tuckerman et al. |
| 5,600,257 A | 2/1997 | Leas et al. |
| 5,601,740 A | 2/1997 | Eldridge et al. |
| 5,773,780 A | 6/1998 | Eldridge et al. |
| 5,806,181 A | 9/1998 | Khandros et al. |
| 5,829,128 A | 11/1998 | Eldridge et al. |
| 5,843,808 A | 12/1998 | Karnezos |
| 5,886,535 A | 3/1999 | Budnaitis |
| 5,959,462 A | 9/1999 | Lum |
| 5,995,428 A | 11/1999 | Chien et al. |
| 6,004,867 A | 12/1999 | Kim et al. |
| 6,005,401 A | 12/1999 | Nakata et al. |
| 6,020,750 A | 2/2000 | Berger et al. |
| 6,028,436 A | 2/2000 | Akram et al. |
| 6,032,356 A | 3/2000 | Eldridge et al. |
| 6,037,794 A | 3/2000 | Yamamoto et al. |
| 6,081,429 A | 6/2000 | Barrett |
| 6,107,119 A | 8/2000 | Farnworth et al. |
| 6,191,487 B1 | 2/2001 | Rodenbeck et al. |
| 6,379,982 B1 | 4/2002 | Ahn et al. |

FOREIGN PATENT DOCUMENTS

JP   409232256 A   9/1997

OTHER PUBLICATIONS

Su et al., "Experimental Results and Modeling Techniques for Substrate Noise in Mixed–Signal Integrated Circuits", IEEE Journal of Solid–State Circuits, vol. 28, No. 4, Apr. 1993, pp. 420–430.

Krishnamoorthy et al., "Ring Oscillators With Optical and Electrical Readout Based on Hybrid GaAs MQW Modulators Bonded to 0.8βm Silicon VLSI Circuits", Electronic Letts, Oct. 26, 1995, vol. 31, No. 22, pp. 1917–1918.

U.S. Patent Application 20020001966 to Ito et al., dated Jan. 3, 2002.

U.S. Patent Application 20020180027 to Yamaguchi et al., dated Dec. 5, 2002.

Primary Examiner—John F. Niebling
Assistant Examiner—Olivia Luk
(74) Attorney, Agent, or Firm—TraskBritt

(57) ABSTRACT

A semiconductor device wafer-on-support wafer package comprising a plurality of segmentable chip-scale packages and method of constructing, burning-in, and testing same is disclosed. The wafer-on-wafer package can be burned-in and tested at the wafer level prior to segmenting, or singulating, the wafer-on-wafer package into a plurality of individual chip-scale packages.

56 Claims, 7 Drawing Sheets

WAFER ON WAFER PACKAGING AND METHOD OF FABRICATION FOR FULL-WAFER BURN-IN AND TESTING

CROSS-REFERENCE TO RELATED APPLICATION

This application is a continuation of application Ser. No. 09/640,739, filed Aug. 17, 2000, now U.S. Pat. No. 6,379,982 B1, issued Apr. 30, 2002.

BACKGROUND OF THE INVENTION

1. Field of the Invention

The present invention generally relates to manufacturing, burning-in, testing, and mounting of semiconductor chips having integrated circuits. More particularly, the present invention relates to wafer-scale manufacturing, burning-in, testing, and mounting of semiconductor chip, or die, packages.

2. Background of the Invention

Typically, when manufacturing a dynamic random access memory device, for example, the manufacturing process includes constructing a semiconductor wafer of a preselected diameter which contains a plurality of individual dies. Currently, the diameter of a typically sized semiconductor wafer will frequently range from approximately 100 mm to approximately 300 mm, but wafers can be sized to have diameters which are smaller or larger than the typical diametrical range. The individual dies are singulated, or severed, from the wafer and are individually placed in packages, including but not limited to, small outline j-lead packages (SOJ), tape automated thin small outline packages (TSOP), chip scale packages (CSP), or any other of a wide variety of chip packages known within the art. After incorporating the individual dies in respective die, or chip, packages, the individual chip packages are often taken through a preburn-in test, a burn-in test which is usually conducted at elevated temperatures and voltages, and low and high speed final tests. Those chips which successfully complete each of the tests are ultimately installed upon the next higher assembly such as a circuit board, flexible substrate, or some other structure to provide a memory device, for example, and which will ultimately be incorporated in an electronic component, or product.

However, with a constant demand on the semiconductor chip industry for providing an ever increasing number of transistors on a single semiconductor chip, to increase memory capacity and/or speed for example, the industry must continuously find ways to overcome problems and inefficiencies encountered in the manufacturing, burning-in, testing, and mounting of chips on the next higher level of assembly so as to remain competitive in the market place. To illustrate, more and more transistors, or devices, are being provided within a given semiconductor die, or chip, and are becoming by necessity larger in size to accommodate the increasing number of transistors, which can range upward of a hundred million ($100 \times 10^6$) individual transistors on a single chip. Thus, it is desirable, if not required, that the final chip package be made as small as possible to counter the physically larger dies contained therein.

One of the technical problems encountered by the industry in such ultra large scale integration (ULSI) technology is how to control, and preferably reduce, the costs associated with burning-in, testing, and then mounting dies on the next higher assembly such as on circuit boards or various substrates to be used in a given end product.

Another problem encountered in manufacturing larger sized dies designed to accommodate an ever increasing number of transistors, or devices, is contending with the stray inductance and parasitic capacitance associated with bond wires extending between the input and output bond pads located on the active surface of the die and bond pads or lead frames of the package that are in turn placed in electrical communication with various circuits on the next level of assembly. For example, a typical bond pad, or contact pad, may have a self-inductance of approximately 3–10 nanohenries (nH) and a typical bond pad, or contact pad, may have a stray capacitance of 0.2 picofarads (pF). Such unwanted, relatively large self-inductances and stray capacitances can become very troublesome upon chip frequencies approaching and exceeding 1 gigahertz.

A further problem encountered when manufacturing chips accommodating a large number of transistors is being able to quickly and reliably test and burn the chips at either a wafer level, or at a packaged chip level, without damaging the bond pads located on the active surface of the chip, or in the alternative, without damaging an electrical lead or an electrical contact that is accessible from the exterior of the chip package.

Other manufacturing and testing difficulties arise from the need to constantly update expensive test equipment as each new generation of chip packages are designed and introduced to the market. This is because such test equipment will often utilize elongated probes or cantilevered probes that resiliently extend from a structure referred to as a probe head, or probe card, in a preselected pattern to make electrical contact with a respective die bond pad either directly, or by temporarily contacting an externally accessible lead, pin, or contact if the die has already been packaged, so that burn-in and testing can be conducted.

A wafer level burn-in system is disclosed in U.S. Pat. No. 5,866,535 issued to Budnaitis which includes a semiconductor wafer being placed in a burn-in apparatus so that bond pads on the active surface of the wafer face upwardly. The system further includes a laminated contact sheet which is positioned on top of the active surface of the wafer and a temporary, compliant, selectively conductive Z-axis member which is positioned on top of the laminated contact sheet, and a movable base unit is positioned above the stacked components of the system. The base unit is then biased downward to electrically couple the base unit, the Z-axis member, the laminated contact sheet, and the bond pads of the wafer so that burn-in and testing of the wafer can be conducted. Upon burning-in and testing of the wafer, the wafer, as well as the various components, are removed from the test apparatus and disassociated from each other so that the wafer can be forwarded for further processing.

U.S. Pat. No. 6,005,401 issued to Nakata et al. discloses a semiconductor wafer burn-in and test apparatus including a retainer board for holding a semiconductor wafer which in turn is brought into contact with a probe sheet having probe terminals corresponding to terminals on the semiconductor wafer so that burn-in and testing can be conducted on the chips or integrated circuits present on the wafer. An elastic member compensates for any unevenness that may exist with respect to the probe terminals of the probe sheet upon contacting the wafer with the probe sheet.

U.S. Pat. No. 5,959,462 issued to Lum discloses a test structure for burn-in testing of a semiconductor wafer in which the test structure incorporates a backing support wafer in which a plurality of segmented individual test integrated circuits have been attached to the backing support wafer.

Conductive bumps of the attached integrated circuits which are attached to the support wafer are brought into electrical contact with integrated circuits on the product wafer so that burn-in testing can be conducted. After burn-in and testing of the product wafer, the test structure, incorporating the backing support wafer and the attached integrated circuits, is removed from electrical contact with the product wafer and the product wafer is then forwarded for further processing. The test structure of Lum is quite elaborate in that yet another silicon wafer mold upon which a thin film signal distribution layer containing various electrical signal routing circuits, optional electrical interconnects and contacts as needed between the layers of thin film signal distribution layer is used in the construction of the test structure for stabilizing the test integrated circuits as they are being attached to the backing support wafer.

U.S. Pat. No. 6,004,867 issued to Kim et al. discloses a chip package assembled at the wafer level which incorporates a silicon substrate attached to the active surface of the wafer which contains a plurality of input/output pads thereon. The substrate includes a top surface and a bottom surface. The bottom surface of the substrate is provided with a plurality of circuit traces configured to terminate at preselected positions on the bottom surface which correspond to the locations of the input/output pads on the active surface of the wafer. The circuit traces are constructed so as to be in electrical communication with a plurality of terminal pads positioned on the top surface of the substrate which may be positioned independently of the input/output pads of the active surface of the wafer. The terminal pads, formed on the top portions of the circuit traces, are provided with metallic bumps which in turn, ultimately electrically and mechanically bond to a circuit board for example. Kim et al. further discloses a method of manufacturing the chip package disclosed therein and includes the steps of providing a wafer, attaching a substrate to form a substrate-wafer-composite, lapping the substrate, forming a plurality of metallic bumps, and cutting the substrate-wafer-composite. Additional steps are set forth wherein the wafer is polished, a barrier metal layer is disposed upon the electrically conductive traces to improve the bonding of the bottom ends of the traces to the input/output pads of the active surface of the wafer, as well as lapping the top surface of the substrate to expose the terminal pads thereof and lapping of the opposite surface of the active surface of the wafer which has been attached to the bottom surface of the substrate.

Interestingly in the manufacturing method disclosed in the Kim et al. patent, the active surface of the semiconductor wafer is lapped to prepare it for attachment to the bottom surface of the substrate, then the top surface of the substrate is subsequently back-lapped after the bottom surface of the substrate has been attached to the active surface of the semiconductor wafer. Additionally, the substrate must undergo some further processing steps after being attached to the active surface of the wafer in order to expose the terminal pads on the top surface of the substrate so that solder balls can then be disposed on the terminal pads which, in turn, will serve to electrically and mechanically attach the terminal pads to, for example, a circuit board using conventional solder attachment techniques. Thus, it appears that if were one to manufacture the chip-size package disclosed in Kim et al., particular care must be taken in preparing the active surface of the wafer to be attached to the upper surface of the substrate to ensure that the active surface of the wafer is very level or flat so as to properly mate against the upper surface of the substrate which also must be very level. This is because the upper ends of the circuit traces that are to be directly attached to respective input/output pads are shown as being flush with the upper surface of the substrate. Therefore, in order for the circuit traces to properly contact the input/output pads of the active surface of the wafer, which are also flush, the levelness, or flatness, of the adjoining services of the substrate and wafer must be properly polished or lapped so that there will be no unwanted surface irregularities that could interfere with the surfaces being properly and fully attached to each other.

U.S. Pat. No. 6,032,356 to Eldridge et al. discloses a technique for providing and mounting a plurality of resilient contact structures directly upon terminals, or pads, located on the active surface of semiconductor dies while still in wafer form. The resilient contact structures can then be brought into temporary contact with corresponding contact pads located on a probe card for burn-in and testing of the yet to be singulated dies. Upon the unsingulated dies having been burned-in and tested, the wafer is forwarded on for further processing including singulation of the dies with the resilient contact structures being available for permanently connecting the dies to higher level circuits, such as a circuit board. The resilient contact structures as disclosed in Eldridge are configurable in a number of shapes and are taught as generally having a gold filament coated with a flexible nickel alloy to obtain the resilient nature of the contact structures. However, spring-like contact structures generally require that a certain amount of force be used to ensure a secure contact during burn-in and testing. When considering the number of resilient contact structures required for use when burning-in and testing ULSI wafers, the cumulative forces required for urging the large number of resilient contact structures to contact a test card, or probe, could become quite significant.

Therefore, it can be appreciated that the art continues to seek ways to produce semiconductor chips, including chips incorporating ULSI technology, in a more efficient, cost-effective manner and in which chips can easily be burned-in and tested, on a wafer-level, by readily available burn-in and test apparatus. Furthermore, the industry continues to seek to produce chips that may be packaged within chip-scale packages that are readily mounted and incorporated within the next level of assembly, such as in, but not limited to, multi-chip memory modules, rigid substrates, flexible substrates including tapes, or directly onto a printed circuit board. Yet further, the industry continues to seek to produce chip-scale packages which can be mounted with connective bonds which have extremely low, or negligible stray inductance and very low parasitic capacitance, especially as the frequency of operation of modern chips approaches and surpasses 1 gigahertz.

BRIEF SUMMARY OF THE INVENTION

The present invention comprises a semiconductor device wafer being mounted on a support wafer to provide a wafer-on-wafer package which can be burned-in and tested prior to singulation of the chip-scale semiconductor die, or device, packages constructed in accordance with the present invention. Upon the wafer-on-wafer package being successfully burned-in and tested, the individual semiconductor packages contained within the wafer-on-wafer package may be singulated from the wafer-on-wafer package on an individual basis, or in groups, and directly mounted onto the next level of assembly such as upon a multi-chip memory module, a printed circuit board, a rigid substrate, or a flexible substrate including tape-like structures, for example. The present invention is particularly suitable for, but not limited to, producing chip-scale packages from semiconductor device wafers incorporating ultra large scale integration (ULSI) technology.

In accordance with the present invention, a device wafer made of a preselected material such as silicon, or other suitable semiconductor material, having integrated circuits on an active surface of the wafer is made available. Preferably the device wafer will have at least one, and preferably a plurality of, unsingulated semiconductor chips, or dice, with each unsingulated chip having a plurality of input/output bond pads on the active surface thereof. In addition to the active surface having integrated circuits thereon, the device wafer will usually have a nonactive, or back surface.

Preferably the support wafer, which is to be bonded to the device wafer, is a rejected semiconductor device wafer from the front-end of a device wafer production line and therefore significantly reduces the costs associated with producing semiconductor wafers by reclaiming what would otherwise be considered scrap material generated by the production line. Thus, the support wafer will ideally be made of the same semiconductor material as the device wafer and will have an identical coefficient of thermal expansion thus eliminating the potential for any thermally induced problems arising from the device wafer and the support wafer expanding and contracting at different rates when subjected to temperature differentials.

The top, or die connect, surface of the support wafer is provided with a plurality of chip, or die bond pad, connection elements, preferably comprising electrically conductive globules such as metallic or nonmetallic solder balls or bumps which are positioned to correspond and be bonded, attached, or otherwise connected to the plurality of bond pads located on the active surface of the device wafer. The die bond pad connections, or elements, of the support wafer are in electrical communication with respective traces which lead to vias, or feed-throughs, which extend through the cross-section of the support wafer to the bottom surface of the support wafer, also referred to as the test connection/mounting sites, or elements, of the support wafer. The vias, or feed-throughs, are arranged in a preselected pattern to preferably correspond with the plurality of test connection/mounting sites, or elements, located on the bottom surface of the support wafer which are arranged in a preselected pattern. The preselected pattern, or grid, of the test connection/mounting sites will usually be of a different, more widely spaced pattern than the pattern of bond pads located on the active surface of each die contained within the device wafer. That is, the test connection/mounting sites, or elements, will likely have a greater individual surface area and pitch, or spacing, between adjacent elements than the die bond pads located on the dies of the device wafer. The vias of the support wafer are partially or fully filled with a preselected conductive material, such as a tin and lead based solder which is flowable at elevated temperatures. The solder preferably forms a first meniscus, or globule, extending to the circuit trace associated with the via on the top surface of the support wafer. The conductive material, or flowable solder, disposed within the via also preferably extends to and slightly beyond the bottom surface of the support wafer so as to terminate in a second meniscus, or globule, such as a solder ball or bump, suitable for being contacted by a test probe and then ultimately to serve as a mounting element that can be bonded so as to provide a mechanically and electrically attachment point to a contact pad, a mounting pad, or other electrically conductive surface located on a printed circuit board, memory module board, or other electronic component or substrate in which the chip-scale die package is to be attached. Additionally or alternatively, conductive paths may be provided in the vias in accordance with the teachings of a copending U.S. patent application filed Aug. 17, 1998, having Ser. No. 09/118,346, incorporated by reference herein, and assigned to the assignee of the present invention.

Upon the support wafer being prepared as described, the active surface of the device wafer and the top surface of the support wafer are aligned with each other and are then joined by using bump or solder ball joint connections, such as controlled collapse chip connections (C4), between the bond pads on the active surface of the device wafer and the corresponding, or complementary, die pad connection elements such as solder balls provided on the die connect surface of the support wafer. Upon the device wafer and the support wafer being bonded or joined to provide a plurality of permanent electrical and mechanical connections between each of the die bond pads and respectively associated die pad connections, the wafer-on-wafer package can then be placed in a burn-in and test apparatus wherein test probes are brought into contact with test connection/mounting sites, or elements, which preferably comprise a plurality of electrically conductive solder balls, located on the bottom surface of the support wafer and which are in electrical communication with respectively associated vias, which in turn are in electrical communication with respectively associated traces, which are, in turn, in electrical communication with die bond pad connect elements, such as solder balls, which have been attached to respective die bond pads arranged in a preselected pattern on at least some, if not every active surface of each unsingulated semiconductor die.

After the wafer-on-wafer package has been burned-in and tested by a suitable wafer burn-in and testing apparatus, the individual dies of the wafer-on-wafer package can then be singulated as needed for subsequent mounting on the next level of assembly. Because the test connection/mounting elements, globules, or solder balls are already in place on the bottom surface of the now singulated chip package, which comprises a portion of the support wafer having test connection/mounting elements thereon, the singulated chip, or chips, are ready to be mounted to the next level of assembly with little or no preparation. The test connection/mounting elements, which preferably are menisci formed by the conductive filling material, or solder, previously disposed in the vias, or feed-throughs, to form globules, such as solder balls or bumps, are bonded to mounting pads, or other suitable surfaces, correspondingly positioned and arranged to accommodate the test connection/mounting elements. Solder ball connection techniques, such as those known in the art as controlled collapse chip connection (C4) techniques, are particularly suitable for bonding the test connection/mounting elements to suitable bonding sites located on a chip accommodating a substrate such as a mounting pad on a printed circuit board, a memory module board, or any other suitable substrate whether it be rigid or flexible.

These and additional features and benefits of the present invention are further described and illustrated in the following detailed description of the invention and the present drawings.

DETAILED DESCRIPTION OF THE INVENTION

The present invention will be first described in reference to drawing FIGS. 1 through 4 of the drawings to provide an overview of an exemplary wafer-on-wafer package 2 embodying the present invention. Thereafter, the present invention will further be described in an intermediate level of detail with references primarily being made to drawing FIGS. 5 through 10 of the drawings. Lastly, the isolated views of exemplary examples and specific aspects of the present invention as illustrated in drawing FIGS. 11 and 12 will be described in detail so as to provide a comprehensive understanding of the present invention.

Figure 1:
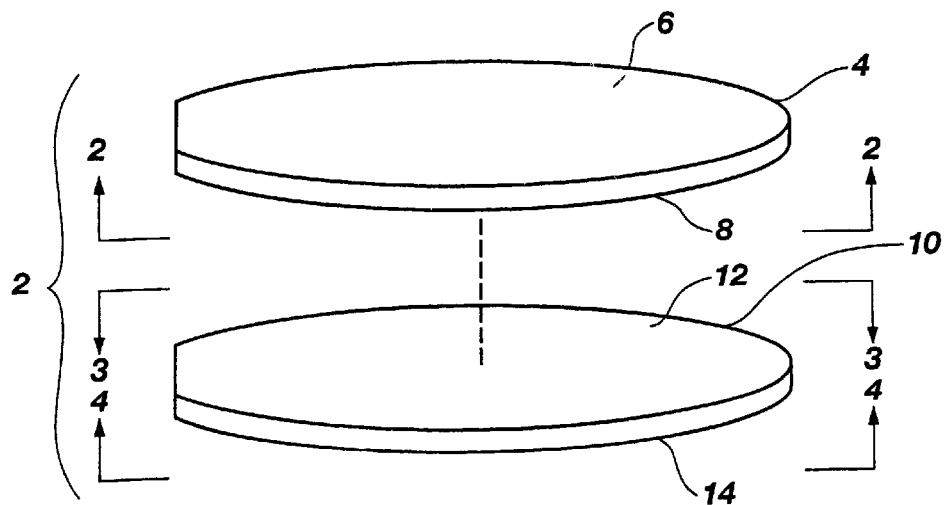
FIG. 1 is an exploded perspective view of an exemplary semiconductor device wafer, comprised of a plurality of unsingulated semiconductor chips, the device wafer is shown positioned above and prior to being attached to an exemplary support wafer in accordance with the present invention.

As shown in drawing FIG. 1, wafer-on-wafer package 2 preferably comprises a device wafer 4 having a nonactive surface 6, shown as facing upward, and an active surface 8, shown as facing downward. An exemplary support wafer 10 having a top, chip, or die connect surface 12, shown facing upward, and a bottom, or testing/mounting surface 14, shown as facing downward, is shown as being positioned below device wafer 4.

Device wafer 4 and support wafer 10 are preferably comprised of any suitable semiconductor material such as silicon, germanium, silicon germanium, silicon carbide, gallium arsenide, selenium, tellurium, or any other suitable semiconductor material. Although device wafer 4 and support wafer 10 need not be formed of the same, or nearly the same material, it is preferred that support wafer 10 be a rejected wafer obtained from the front end of the production line in which device wafer 4 was formed. Such defects which would cause a wafer to be rejected for use as a device wafer, but which would not interfere with the wafer being used as a support wafer in accordance with the present invention, typically include open circuits and short circuits in the interconnection wiring of one or more of the semiconductor dice of the wafer or any other circuitry of the wafer. Thus, in the ideal situation, support wafer 10 will have been constructed of the exact same material as device wafer 4, and support wafer 10 will have identical electrical, mechanical, and material properties. For example, support wafer 10 and device wafer 4 will have essentially the same, if not identical, coefficients of thermal expansion, dielectric properties, structural strengths and rigidity, as well as other shared qualities and other properties that will ensure optimal compatibility of the attachment of device wafer 4 to support wafer 10 as will be described in more detail herein.

Figure 2:
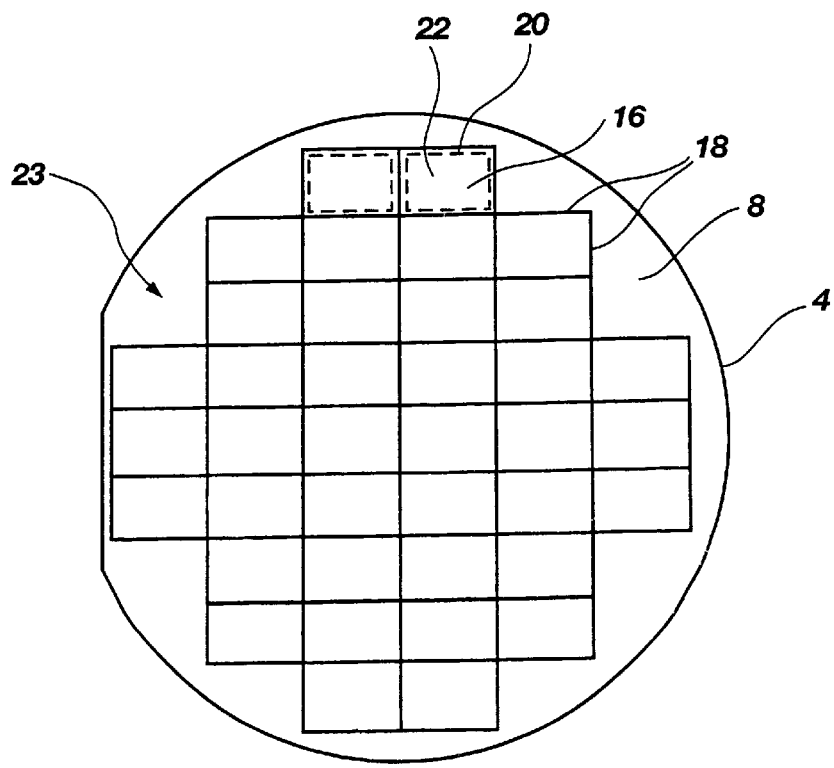
FIG. 2 is a bottom view of the exemplary semiconductor device wafer of FIG. 1 as viewed in the direction depicted by line 2—2.

A top view of active surface 8 of device wafer 4 is shown in drawing FIG. 2, in which representative, yet to be singulated, semiconductor dies 16, are individually distinguishable from each other by way of interpositioned scribe lines 18, which are commonly referred to as "streets" and "avenues." The row and column pattern of unsingulated semiconductor dies 16 depicted in drawing FIG. 2 is typical; however, any suitable die pattern can be utilized in practicing the present invention. Ultimately, semiconductor dies 16 will be cut, or diced, along scribe lines 18 by a diamond saw or by other apparatus.

Each semiconductor die, or device, 16 comprises an active surface 22, and as representatively shown in two of the plurality of semiconductor dies 16 shown in drawing FIG. 2, a plurality of die bond pads 20 are situated on each active surface 22 of each die 16 in a preselected die bond pad pattern, or array, 23. Although the representative dies shown in drawing FIG. 2 are depicted as having die bond pads, also referred to as bond pads, die pads, or input/output pads, 20 positioned about the periphery of die 16, as will be discussed further herein, die bond pads 20 can be positioned anywhere on active surface 22, including within, or more toward the center of active surface 22 of semiconductor dies 16 if desired.

Figure 3:
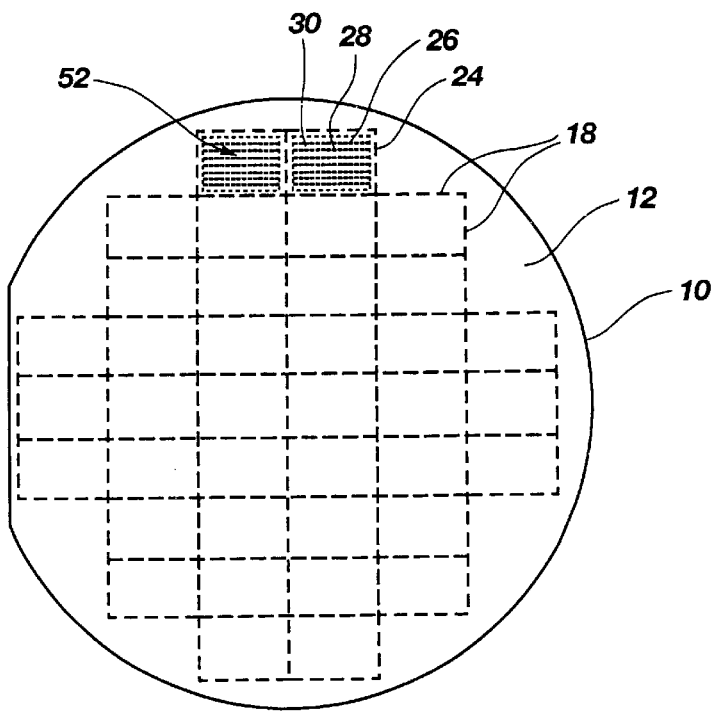
FIG. 3 is a top view of the exemplary support wafer of FIG. 1 as viewed in the direction depicted by line 3—3.
Figure 4:
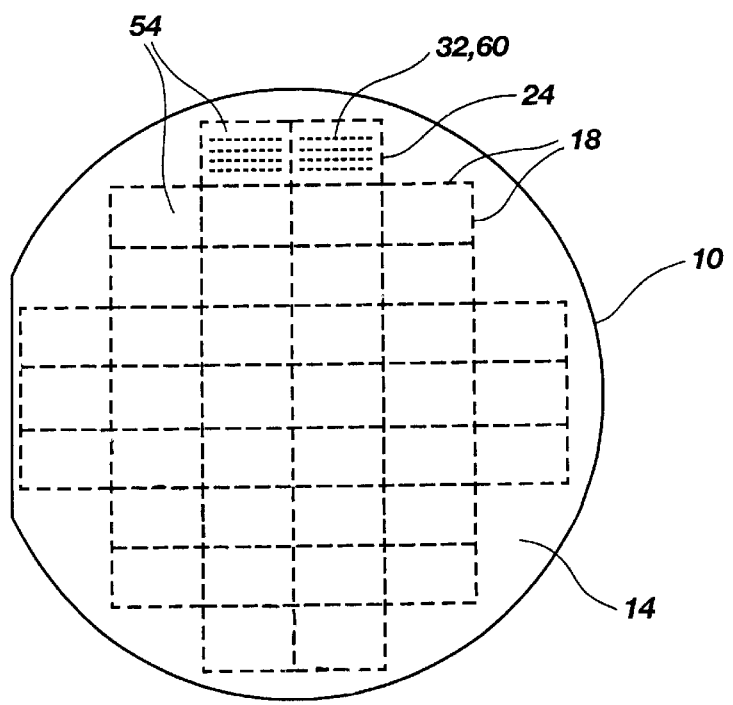
FIG. 4 is a bottom view of the exemplary support wafer of FIG. 1 as viewed in the direction depicted by line 4—4.

A top view of exemplary support wafer 10 is shown in drawing FIG. 3 and a bottom view of exemplary support wafer 10 is shown in drawing FIG. 4. As can be seen in drawing FIG. 3, die connect surface 12 of support wafer 10 includes two representative regions of the plurality of die connect, or attach, regions 24 showing in a general manner that preferably each of die connect regions 24 has a plurality of electrically conductive die bond pad connections 26, a plurality of electrically conductive traces 30 being respectively associated with each die bond pad connection 26, and electrically conductive traces 30 leading to associated feed-throughs, or vias, 28 extending through the support wafer 10 to the opposite, or bottom surface 14 (FIG. 4) thereof so as to provide respective paths of electrical communication between each of the die bond pad connections 26 and respectively associated test connection/mounting sites, or elements, 60 (FIG. 4) located on testing/mounting surface 14. Die bond pad connections 26, conductive traces 30, and vias 28 of each die connect region 24 are arranged into a preselected die pad connection/via pattern, or array, 52, so as to provide a corresponding die bond pad connection 26 for selected, if not every, die bond pad 20 on active surface 22 of each die 16. Similarly test connection/mounting sites, or elements 60 such as solder balls or bumps, 32 (FIG. 4) are arranged so as to provide a test connection/mounting element pattern, or grid array, 62 (FIG. 7) in which selected, if not every, test connection/mounting element 60 that will be accommodated by a corresponding contact pad, mounting pad, or other structure located and arranged in a complementary pattern, or array, on a printed circuit board, memory module board, a suitable substrate, or other component in which each test connection/mounting element 32, 60 is to be mechanically and electrically secured.

Preferably each of the individual die connect regions 24, which are easily distinguishable from each other by scribe lines 18, are preferably positioned in a row and column pattern which corresponds to the row and column pattern of semiconductor dies 16 of device wafer 4 as shown in drawing FIG. 2. Scribe lines 18, shown as being dotted lines in drawing FIGS. 3 and 4, also denote "avenues" and "streets" as provided on active surface 8 of device wafer 4 and as shown in drawing FIG. 2. By providing scribe lines 18 on top, chip, or die connect surface 12 and/or by providing such scribe lines 18 on bottom, or testing/mounting surface 14 of support wafer 10, such will serve to facilitate pre-alignment and subsequent mutual attachment of device wafer 4 and support wafer 10. Additionally, by providing scribe lines 18, the sawing or singulation of semiconductor dies 16 and corresponding regions 24 will, at the appropriate time to perform such sawing, facilitate the singulation of each die 16 and corresponding region 24 to provide a chip-scale package having defined boundaries 50 in accordance with the present invention. However, such scribe lines 18 need not necessarily be provided if not desired, but in general, scribe lines 18 provide convenient references to identify particular regions 24 and/or particular unsingulated semiconductor dies 16 and for various purposes including orienting and aligning device wafers 4 and support wafers 10. Because each die connect region 24 of support wafer 10 preferably is to correspond to a complementary, respectively positioned die 16 of device wafer 4, the plurality of regions 24 are likewise preferably arranged to correspond to the preselected pattern in which semiconductor dies 16 are arranged on device wafer 4 in a mirror-image like manner. Thus, when the time comes to join die connect surface 12 of support wafer 10 to active surface 8 of device wafer 4, generally as shown by the dotted line extending between device wafer 4 and support wafer 10 in drawing FIG. 1, each die 16 of device wafer 4 can be initially aligned with its respectively associated test connection/mounting region 54 by way of scribe lines 18 prior to a more precise alignment being conducted by a wafer alignment apparatus commonly used within the art.

Figure 5:
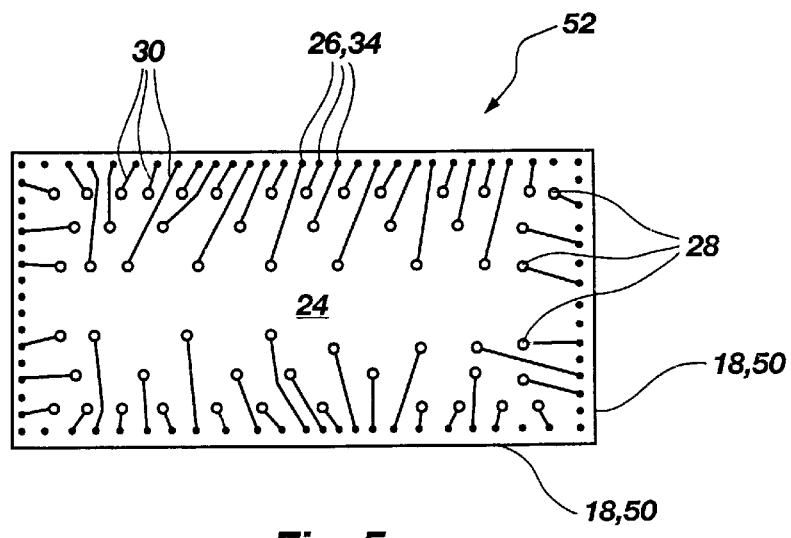
FIG. 5 is a plan view of an isolated representative die connect portion of the top, or die connect surface, having an exemplary die pad connection pattern and associated exemplary conductive via pattern of the exemplary support wafer shown in FIGS. 1 and 3.
Figure 6:
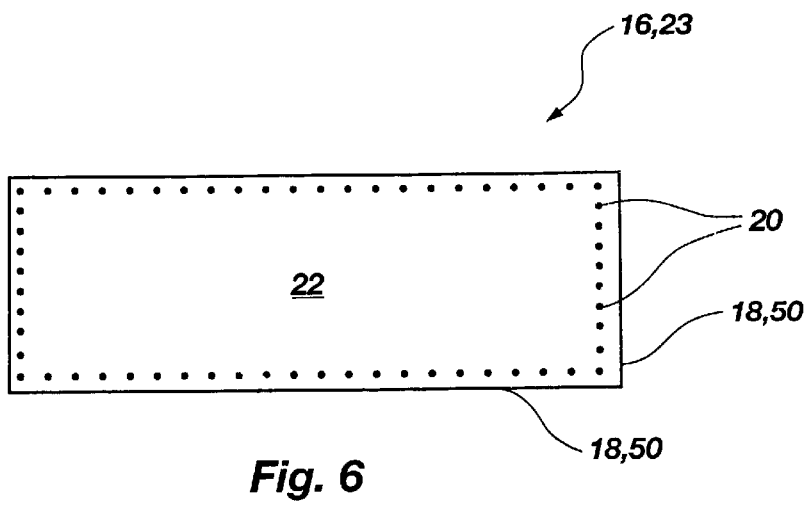
FIG. 6 is a plan view of an isolated representative active surface of an unsingulated die to be attached to the representative die connect portion shown in isolation in FIG. 5.
Figure 7:
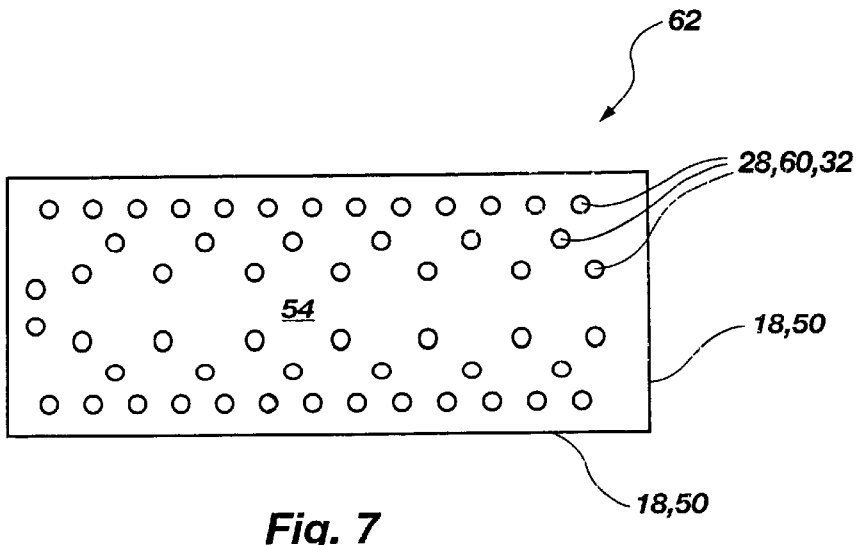
FIG. 7 is a plan view taken in isolation of the opposite side, or the testing/mounting surface of the support wafer, of the representative die connect portion of the support wafer as shown in FIG. 6.

Referring now to drawing FIGS. 5 through 7 wherein drawing FIG. 5 provides an isolated plan view of a representative die connect region 24 having an exemplary die pad connection/via pattern 52. As mentioned earlier, die pad connection/via pattern 52 comprises a preselected arrangement in which die bond pad connections 26 are located proximate the periphery of die connect region 24 so as to correspond, in mirror image fashion, with respective die bond pads 20 arranged in a die bond pad pattern, or array, 23 and which are shown positioned on active surface 22 of representative die 16 shown in isolation in drawing FIG. 6. However, die 16 at this point has not yet been singulated from wafer-on-wafer package 2 (not shown). As discussed earlier, scribe lines 18 serve to denote the physical boundaries of each die 16 of the device wafer 4 (not shown) and associated regions of the support wafer 10 (not shown). Upon singulation, or segmentation, of die packages from the wafer-on-wafer package 2, scribe lines 18 will in effect become the boundary, or periphery, 50 of each die package. Referring back to drawing FIG. 5, die bond pad connections 26 can comprise any electrically connective element suitable for making electrical contact and being permanently attached to die bond pads 20 (not shown) of die 16 (not shown). Appropriately sized globules, solder balls, or bumps formed of selected conductive materials are particularly well-suited for serving as die bond pad connections 26. Conductive traces 30, which are preferably comprised of copper, or a copper alloy, extend between die bond pad connections 26 to respective vias, or feed-throughs, 28 which are also depicted in drawing FIG. 5. Conductive traces 30 are preferably located on die connect region 24 as such location is convenient for forming conductive traces 30 by photolithography or other known methods. Furthermore, by placing conductive traces 30 on die connect region 24 and then securing die connect region 24 to active surface 22 of die 16, conductive traces 30 will be interpositioned, or sandwiched, between die connect region 24 and active surface 22 of device wafer 4 and support wafer 10 prior to die singulation to protect the conductive traces 30 from accidental damage during the burn-in and testing process. Furthermore, upon singulating die packages from the wafer-on-wafer package 2, conductive traces 30 of each die 16 will remain sandwiched between the active surface 22 of the die 16 and the die connect region 24 to further protect conductive traces 30 from damage or exposure to the environment when the singulated die packages, also referred to as chip-scale packages, are placed into service.

Vias 28 as depicted, are generally located inwardly toward the center of die connect region 24 and therefore are able to be spaced apart from each other more so than die bond pads 20. The particular pattern, or array, 52 in which vias 28 are arranged is primarily the result of arranging vias 28 to correspond with respective test connection/mounting sites, or elements, 60 located at the distal ends of vias 28 which emerge on the surface of test connection/mounting region 54 as shown in drawing FIG. 7. Thus, vias 28 terminate at the surface of test connection/mounting region 54 resulting in test connection/mounting sites, or elements, 60 being arranged in a preselected test connection/mounting element pattern, or grid array, 62 that will match a corresponding pattern of mounting pads, contact pads, terminals, or other elements located on a substrate, a printed circuit board, a memory module board, or any other suitable surface or component in which singulated die packages will ultimately be mounted upon.

Thus, by aligning vias 28 so as to correspond with respective test connection/mounting sites, or elements, 60, there is no need to provide circuit traces extending from selected vias 28 to such test connection/mounting sites 60 similar to conductive traces 30 on the surface of test connection/mounting region 54, or in a general sense testing/mounting surface 14 of support wafer 10. However, circuit traces, in addition to or in lieu of conductive traces 30 on the surfaces of die connect regions 24 of die connect surface 12 of support wafer 10, could be provided on one or more of the surfaces of test connection/mounting regions 54 of testing/mounting surface 14 of support wafer 10 if desired. Preferably test connection/mounting sites, or elements, 60 comprise electrically conductive globules, such as, but not limited to, solder balls, or bumps, 32 which are particularly suitable for providing a mechanical and electrical point of attachment to correspondingly positioned mounting pads or other elements arranged and designed to accommodate electrically conductive globules, such as solder balls, or bumps, 32.

Figure 8:
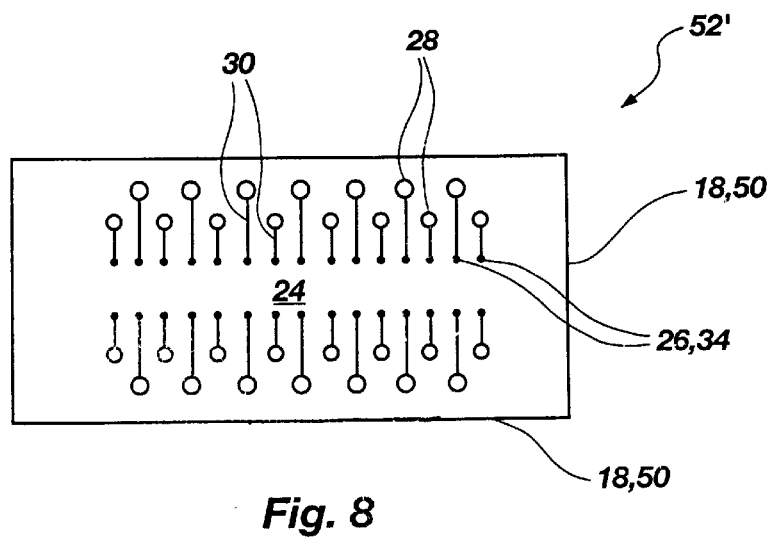
FIG. 8 is a plan view taken in isolation of a die connect portion having an alternative die pad connection pattern and an associated alternative conductive via pattern.
Figure 9:
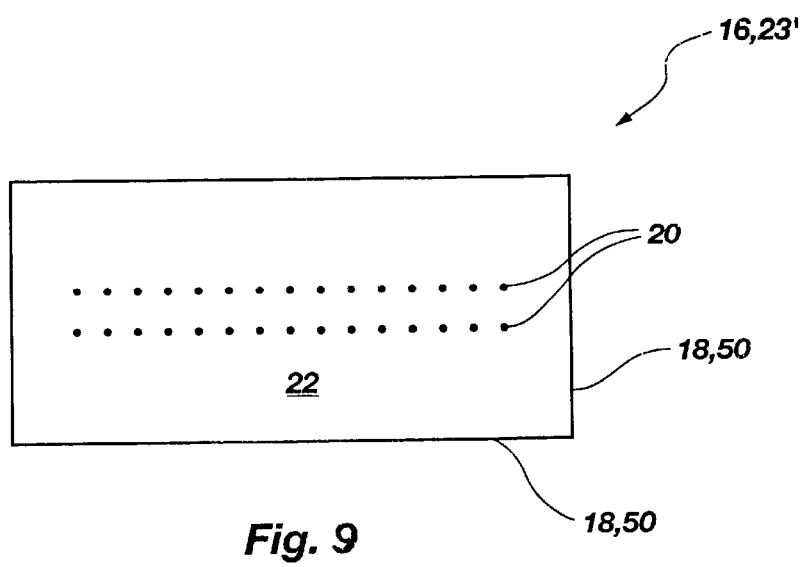
FIG. 9 is a plan view taken in isolation of the active surface of an unsingulated die having an alternative die bond pad pattern.
Figure 10:
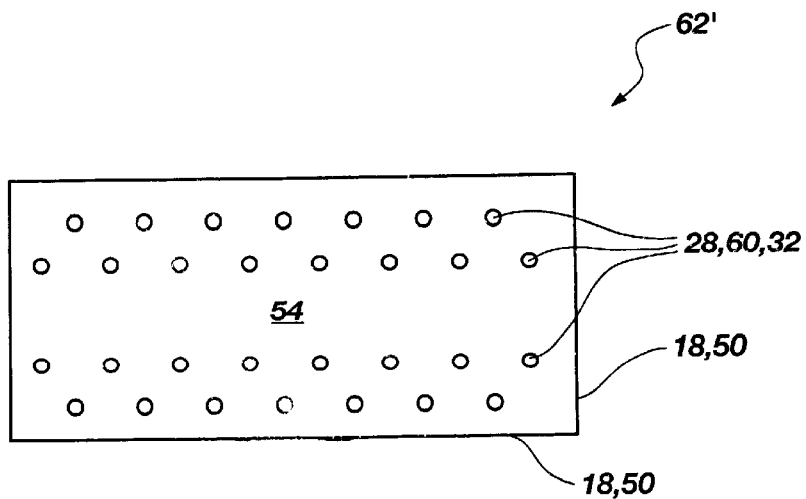
FIG. 10 is a plan view taken in isolation of the opposite side, or the testing/mounting surface of the support wafer, of the alternative die connect portion of the support wafer as shown in FIG. 8.

Referring now to drawing FIGS. 8 through 10 wherein an alternative die bond pad connection/via pattern 52' for accommodating an alternative die bond pad pattern 23' of die 16 and alternative test connection/mounting site, or element, pattern 62' are shown. Otherwise, drawing FIGS. 8 through 10 make use of the same reference numbers used in drawing FIGS. 5 through 7. As can be seen in drawing FIG. 9, die bond pad pattern 23' provides for die bond pads 20 to be arranged generally within the center of active surface 22 of die 16 as compared with being positioned about the periphery of die 16 as depicted in drawing FIG. 6. It should of course be understood that the present invention may be used in connection with any variety of die bond pad patterns comprising any quantity of die bond pads 20 and that die bond pad patterns 23 and 23' are merely exemplary.

Correspondingly, die bond pad connections 26, which preferably comprise electrically conductive globules, such as solder balls, or bumps, 34 are arranged in a preselected die bond pad connection/via pattern 52' so as to be a mirror image pattern of die bond pad pattern 23' in which die bond pads 20 are arranged. Circuit traces 30 likewise have preferably been disposed on die attach region 24 to selectively connect die bond pad connections 26 with associated vias, or feed-throughs, 28. Vias 28 are at least partially, or more preferably, fully filled with a conductive material such as solder and extend from die connect region 24 and emerge on test connection/mounting region 54 to provide a plurality of test connection/mounting sites, or elements, 60 arranged in an alternative test connection/mounting site, or element, pattern 62'. Preferably, each test connection/mounting site, or element, 60 further comprises an electrically conductive globule, such as a solder ball, or bump, 32 to serve as an electrically conductive test connection and which would also eventually serve as an electrically conductive mounting element to be mechanically and electrically attached to an accommodating mounting pad or other structure located on a suitable substrate, printed circuit board, memory module board, or other electronic component in which a singulated die package is to be mounted and subsequently be placed into service.

Referring now to drawing FIG. 1, which shows in detail an enlarged cross-sectional view of a representative, isolated portion of a device wafer just prior to being attached to a support wafer to form a wafer-on-wafer package 2 in accordance with the present invention.

Figure 11:
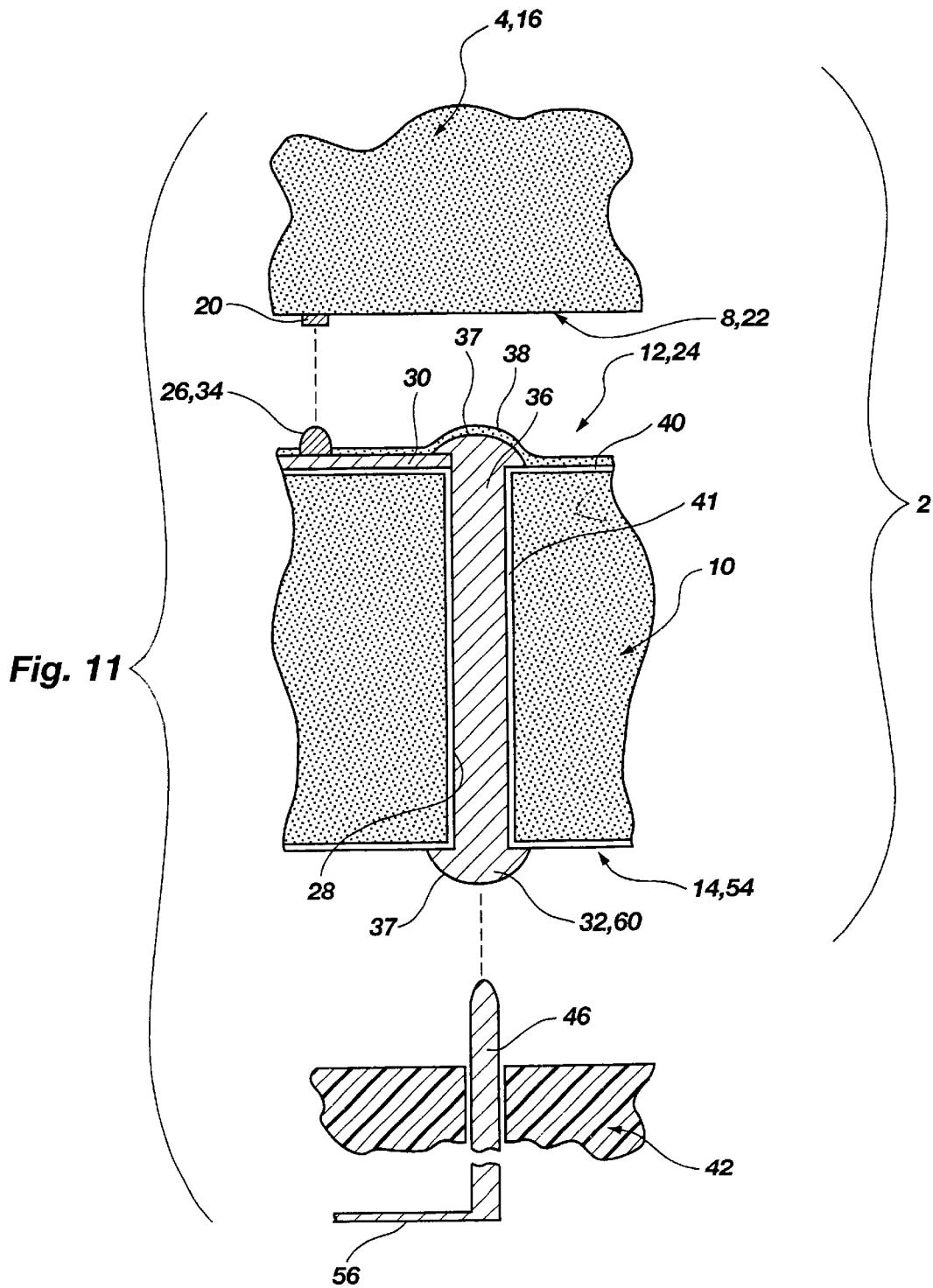
FIG. 11 is an exploded, isolated cross-sectional view of a representative bond pad of an unsingulated die of an exemplary device wafer prior to being attached to a representative, complementary die pad connection element on an exemplary support wafer comprising a solder ball on the exemplary support wafer having an associated electrical trace, conductive via, and a second solder ball which will subsequently be contacted by a representative test probe.

As can be seen in drawing FIG. 11, a very isolated representative portion of a device wafer 4 having a die bond pad 20, which has been shown as protruding slightly from active surface 8 of device wafer 4, which is also active surface 22 of one of the plurality of semiconductor dies 16 contained therein is shown. In actuality, die bond pad 20 instead of protruding slightly, is more likely to be flush with active surface 22 due to the presence of a passivation layer such as silicon dioxide having been disposed thereon (not shown). However, and regardless of whether die bond pads 20 protrude slightly from, are flush with, or even if they are recessed slightly within active surface 22, such will not negatively affect the workability or impede upon the multiple benefits offered by the present invention because the size and/or shape of die bond pad connections 26, which preferably comprise an electrically conductive globule, solder ball, or bump 34, can be altered as needed to ensure each die bond pad connection 26, globule, ball, or bump 34, sufficiently contacts and attaches to each respective die bond pad 20 while also providing a desired amount of clearance between individual active surfaces 22 of active surface 8 of device wafer 4 and any structure which may happen to protrude from top, chip, or die connect surface 12 of support wafer 10.

The isolated portion of support wafer 10 provides a cross-sectional view of conductive trace 30, which may be copper, a copper based alloy, or any other suitable electrically conductive material that can be disposed on support wafer 10 by a variety of known processes including without limitation, screen printing, sputtering, and vapor deposition, for example. If desired, additional substances or materials can be added on or within conductive traces 30 to enhance the conductivity and/or attachment characteristics of conductive traces 30 to support wafer 10 and/or die bond pad connection 26.

With respect to die bond pad connection 26, preferably the electrically conductive elements are shaped and configured to have a globule-like geometry such as a solder ball, or bump, 34. Globule, solder ball, or bump 34 may be comprised of any electrically conductive material, such as, but not limited to, various metallic alloys including tin, lead, gold, aluminum, and copper, as well as electrically conductive ceramics and plastics which are disposed either directly onto a portion of electrical conductive trace 30, or are otherwise disposed on die connect surface 12, which includes die connect region 24, so as to be in electrical connection with electrical conductive trace 30. Particularly suitable electrically conductive materials in which globules, solder balls, or bumps 34 can be formed of include gold, tin and lead, as well as other suitable materials such as composite solder balls of copper and silver, copper and solder, copper and other alloys coated thereon, a polymer core and conductive coating thereon, a conductive polymer core and conductive coating thereon, etc.

By forming die bond pad connections 26 to include the preferred globular shape such as provided by globules, solder balls, or bumps 34, and further by selecting a suitable electrically conductive material such as, but not limited to, gold or a tin and lead based solder, the associated stray capacitance can be as low as 0.05 pF and the self-inductance minimal, with these values decreasing to even lower values as bonding technologies such as C4 continue to be improved upon. Such low values of self-inductance and capacitance become very important as the operating frequency of chip packages approach and exceed 1 gigahertz.

Furthermore, support wafer 10 can be provided with a passivation layer 40, such as an oxide, silicon dioxide, a nitride, or any other substance or material which may provide suitable passivation characteristics. Passivation layer 40 can cover die connect surface 12/die connect, or attach, region 24, testing/mounting surface 14/test connection/mounting region 54, as well as cover the interior surface wall of via, or feed-through, 28 which extends from die connect region 24 to test connection/mounting region 54.

Preferably via, or feed-through, 28 is preformed in support wafer 10 prior to attaching device wafer 4 to support wafer 10. Suitable methods of forming via, or feed-through, 28 include, but are not limited to, laser drilling, electrochemical anodization, or by an etchant process such as set forth in United States patent application entitled Methods of Forming Coaxial Integrated Circuitry Interconnect Lines, and Integrated Circuitry, filed Jul. 17, 1998, and having Ser. No. 09/118,346. Vias 28 may have an internal diameter on the order of magnitude of 25 $\mu$m; however, smaller or larger diameter vias may be formed as deemed necessary.

After each via 28 is formed in support wafer 10, a thin oxide to serve as a diffusion barrier 41 may be grown in the via by way of thermal oxidation at an elevated temperature approaching or exceeding 1,000° C. Alternatively, a thin oxide may be grown within via 28 by plasma oxidation at a lower temperature having a magnitude of approximately 600° C. or less. It is preferred that a layer of titanium nitride of approximately 20 to 30 nm be deposited on the interior wall forming via 28 followed by the deposition of a very thin copper film on the order of 10 nm on top thereof. The titanium nitride layer and the copper layer, or film, may be formed, for example, by chemical vapor deposition (CVD) techniques known within the art. Optionally, other substances and methods of providing a diffusion layer within the plurality of vias 28 may be used as deemed most suitable for the die, or chip, packages being constructed.

After each via 28 has been provided with a suitable diffusion barrier 41, a conductive filling material 36 can then be disposed within via 28 to provide an electrically communicative path between die bond pad 20, globule, solder ball, or bump 34, conductive trace 30, and test connection/ mounting site, or element, 60 preferably comprising a globule such as a solder ball, or a bump, 32. Conductive filling material 36, preferably a tin/lead based solderable material, is introduced within via 28 by floating support wafer 10 in a heated solder bath whereupon solder is drawn into each of the vias 28 by capillary action. The capillary action is further augmented by the fact that tin/lead wets the copper and thus the tin/lead solder of the bath readily travels within and fills via 28 due to via 28 having a thin film of copper disposed on the inner wall thereof. Upon withdrawing support wafer 10 from the solder bath, convex-shaped menisci, designated with reference numerals 37, will be formed at both ends of conductive via 28. That is on die connect region 24 and which in effect forms test connection/mounting element 60, which preferably provides an electrically conductive globule, solder ball, or bump, 32 on the surface of test connection/mounting region 54 of support wafer 10. Oppositely positioned meniscus 37, which preferably overlaps and adheres to a portion of conductive trace 30 to provide electrical continuity therewith, may be planarized by a chemical mechanical planarization (CMP) process or left as is if the height in which meniscus 37 extends from die connect, or attach, region 24 is such that it will not interfere with the attachment of device wafer 4 with support wafer 10. Likewise, test connection/mounting elements 60, preferably being provided in the form of globules, solder balls, or bumps 32, can be partially planarized on the outermost surface thereof if deemed necessary, but will most likely not need to be planarized as it is desired that the preferred convex-shaped geometry of a globule, solder ball, or bump 32 be left intact so as to provide plenty of material to enable a test probe 46 of a probe card 42 to easily make contact with the outer surface of the meniscus 37 preferably taking the shape of a globule, solder ball, or bump 32, and during the burn-in and testing of the postassembled wafer-on-wafer package 2 as well as to provide plenty of material for the secure bonding of electrically conductive test connection/ mounting element 60, including when configured in the preferred shape of a globule, solder ball, or bump 32 which is particularly suitable for being bonded to a mounting pad 48 (FIG. 12) or other suitable structure, in due course.

Preferably relatively smaller sized globule, solder ball, or bump 34, which typically is sized to have a maximum diameter not exceeding approximately 5 $\mu$m, is formed onto a terminal end of electrically conductive traces 30 after conductive filling material 36 has been provided within via 28. Of course such globules, solder balls, or bumps 34 can be larger or smaller as deemed appropriate. An overlayer 38 may now be disposed over die connect region 24 and preferably over the entire die connect surface 12 of wafer support 10. Overlayer 38 can be an oxide or a nitride of silicon or a combination thereof or a polymer film with a low dielectric constant or be of any desired material to provide a desired level of electrical and environmental insulation. Die bond pad connections 26 and/or globule, solder ball, or bumps 34 can be cleared of overlayer 38 by etching so as not to impede the electrical and mechanical contact that each globule, solder ball, or bump 34 is to make with its respective die bond pad 20.

Controlled collapse chip connection (C4) techniques and other known solder bonding or bump bonding techniques and processes are used in joining device wafer 4 with support wafer 10. Preferably the processes selected for use will include prealigning all die bond pads 20 of active surface 8 with respect to all respective test connection/ mounting elements 60, preferably configured in the form of globules, solder balls, or bumps 34, which are present on die connect surface 12 and wherein each die bond pad 20 and complementary positioned globule, solder ball, or bump 34 to be bonded will include subjecting the die bond pads 20, and globules, solder balls, or bumps 34 to temperatures and pressures which will remelt the globules, solder balls, or bumps 34 and result in a reliable mechanical and electrical bond, or bridge, to be formed between each globule, solder ball, or bump 34 and associated die bond pad 20. Furthermore, the remelt operation will inherently facilitate a degree of self-alignment by way of capillary action between each die bond pad 20 and globule, solder ball, or bump 34 to further ensure a solid, reliable connection therebetween.

Figure 12:
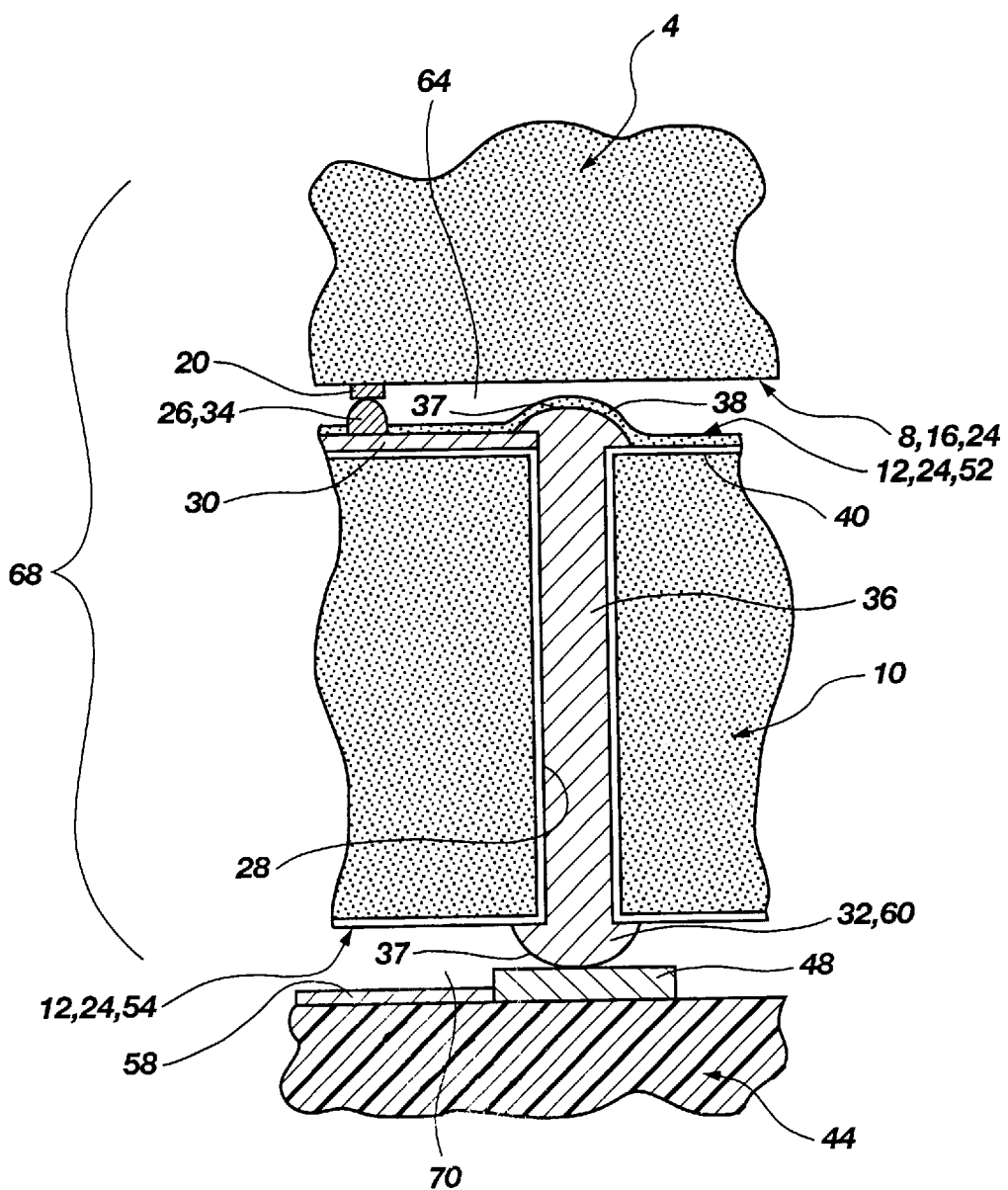
FIG. 12 is an isolated cross-sectional view of a representative portion of a chip-scale package after being cut, or singulated, from an assembled device wafer-on-support wafer package and upon the postsingulated chip scale package being mechanically and electrically attached to a complementary contact pad of a structure to receive the chip package such as a printed circuit board, a mounting board of a multichip memory module, or a suitable substrate.

After device wafer 4 and support wafer 10 have been attached by way of die bond pads 20 and the preferred electrically conductive globules, solder balls, or bumps 34 to form wafer-on-wafer package 2, any remaining gap 64, an isolated portion of which is viewable in drawing FIG. 12, which remains between active surface 8 of device wafer 4 and die connect surface 12 of support wafer 10 can be filled and sealed with an inert encapsulant such as an epoxy based encapsulant, or any other material suitable for repelling moisture and contaminants while also providing additional mechanical securement of device wafer 4 and support wafer 10, to result in a more structurally stable wafer-on-wafer package 2 without interfering with the electrical communicative paths now established and extending between each die bond pad 20, test connection/mounting elements 60/globules, solder balls, or bumps 34, conductive traces 30, and conductive filling materials 36.

Figure 13:
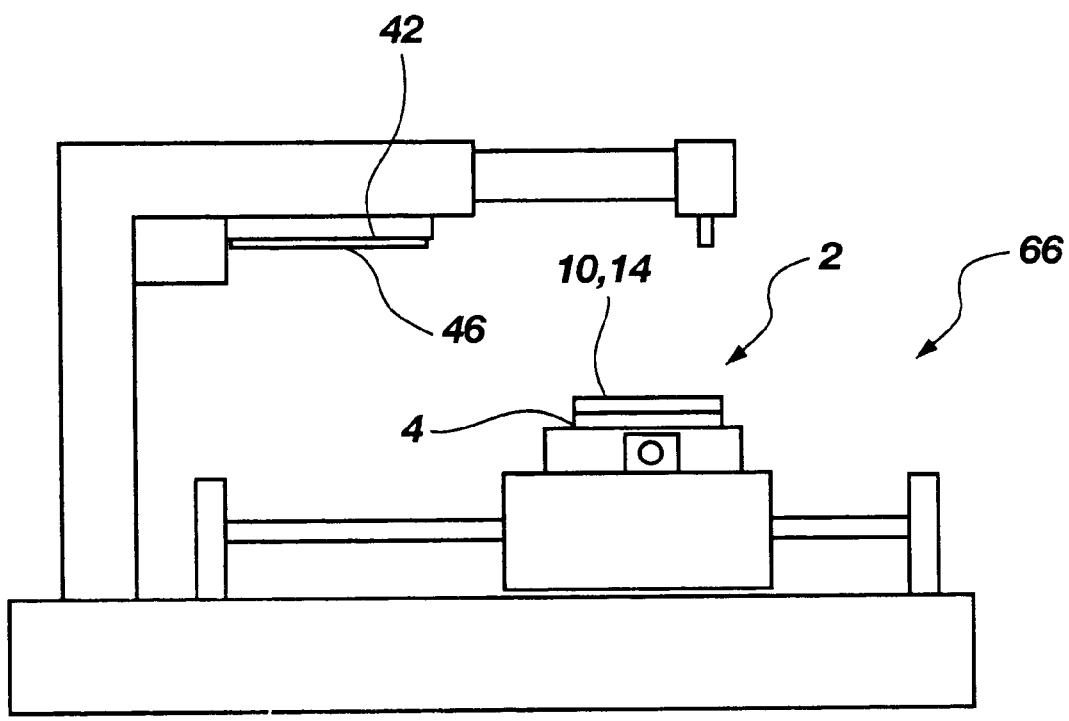
FIG. 13 is a simplified illustration of a wafer-on-wafer package having been installed in a representative burn-in and test apparatus in order for burn-in and testing to be performed thereon.

At this point, wafer-on-wafer package 2 is ready for being burned-in and tested in a wafer scale burn-in and test apparatus such as illustrated in drawing FIG. 13 and denoted by reference numeral 66. Wafer-on-wafer package 2 is installed within apparatus 66, which usually, by way of optical alignment devices in which apparatus 66 is equipped, will automatically index wafer-on-wafer package 2 so that testing/mounting surface 14 will be properly aligned and ready to be contacted by a test probe card 42 having a plurality of test probes 46 arranged in a preselected test probe pattern which is essentially a mirror image of test connection/mounting element pattern, or grid array, 62 (not shown) comprised of a plurality of test connection/mounting sites, or elements, 60 (not shown), which preferably further comprise a plurality of electrically conductive globules, solder balls, or bumps 32 as described earlier.

The lower most portion of drawing FIG. 11 shows such a representative test probe 46 extending from an isolated portion of probe card 42 and wherein test probe 46 and preferred globule, solder ball, or bump 32 will be brought into contact with each other so as to complete an electrical circuit between test probe 46 which, in turn, is electrically connected by way of test circuit trace, or lead, 56 with burn-in and testing circuit software and hardware (not shown). Because each die bond pad 20 by way of respectively associated globules, solder balls, or bumps 34, conductive traces 30, and conductive filling material 36 allows each die 16 on device wafer 4 to be fully exercised and tested at elevated temperatures and voltages, it is possible to determine and identify which dies are good (KGDs) and which are bad before they are singulated from the wafer-on-wafer package 2. It should be noted that because nonactive surface 6 of device wafer 4 remains exposed and readily accessible, nonactive surface 6 can be provided with, on a temporary or permanent basis, any suitable means for cooling, such as cooling fins, liquid cooling channels, or heat sinks, which can be used to thermally modulate and prevent the overheating of wafer-on-wafer package 2 during burn-in and testing.

Upon wafer-on-wafer package 2 being burned-in and tested, wafer-on-wafer package 2 is removed from burn-in and test apparatus 66 and individual die packages 68 (FIG. 12) are singulated from wafer-on-wafer package 2 along scribe lines 18, which is frequently performed by a high-precision diamond saw. The now singulated individual die packages 68 can then be mounted on the next level of assembly preferably by conventional C4 solder ball, or bump, bonding techniques and processes. An isolated portion of a representative singulated individual die package 68 being mounted on a printed circuit board, memory module board, or other suitable mounting substrate 44 is shown in drawing FIG. 12. Singulated individual die package 68 comprises at least one semiconductor die 16 that has been segmented from wafer-on-wafer package 2 (not shown) and thus will comprise a segment of device wafer 4 being respectively connected to a same-sized segment of support wafer 10 generally defined by boundary 50 (not shown in drawing FIG. 12) of die connect region 24. In a similar fashion in which globule, solder ball, or bump 34 is preferably bonded to die bond pad 20, preferred globules, solder balls, or bumps 32 are electrically and mechanically attached to an electrically conductive mounting pad 48 by conventional C4 technology or by other known solder ball, or bump, bonding techniques utilizing elevated temperatures and pressures which are sufficient to reflow and reform globule, solder ball, or bump 32 with mounting pad 48. Mounting pad 48 is usually but one of a plurality of mounting pads 48 positioned on mounting substrate 44 so that each test connection/mounting element 60, preferably comprising a globule, solder ball, or bump 32, is correspondingly attached to a complementary positioned mounting pad 48. Because a plurality of globules solder balls, or bumps 32 and mounting pads 48 have been cojoined, singulated individual package 68 will be adequately secured to mounting substrate 44. However, as with gap 64 between support wafer 10 and device wafer 4, any gap 70 between the segment of support wafer 10 now forming singulated individual die package 68 can also be filled with a suitable encapsulant such as an epoxy material if additional environmental protection is desired and/or if additional mechanical securement is desired. Furthermore, mounting pads 48 can be provided with a meniscus, ball, or bump of electrically conductive, solderable material having a lower melting temperature than the melting temperature of the conductive filling material 36 and/or globule, solder ball, or bump 34, or other die bond pad connection 26. By doing so the bonding of globule, solder balls, or bumps 32 to mounting pads 48 may be performed at a lower temperature so as not to jeopardize the integrity of the previously conducted solder operations. Mounting pads 48 can be formed of any suitable electrically conductive material, including aluminum. Mounting pads 48 are typically in electrical communication with respective conductive traces 58 which may extend along the mounting substrate 44 proximate singulated individual die package 68, as shown in drawing FIG. 12, or may be positioned and extend in any suitable manner including through the cross-section of substrate 44. Moreover, substrate 44 is not limited to printed circuit boards, memory module boards can be of a flexible or rigid nature, or could also, for example, comprise another active semiconductor device having suitable mounting pads or other surfaces which could accommodate test connection/mounting elements 60 which preferably comprise globules, solder balls, or bumps 32. It should also be appreciated that wafer-on-wafer package 2 need not to have each die 16 singulated out of wafer-on-wafer package 2 to provide a singulated individual die package 68. Alternatively, a group, or cluster, of semiconductor dies 16 can be singulated from wafer-on-wafer package 2 to provide a multi-chip package having a plurality of active, unsingulated dies left intact and as supported by mutually equally sized segments of support wafer 10.

Having thus described and illustrated an exemplary wafer-on-wafer package 2 and die package constructed in accordance with the present invention, it will be understood that various changes, adaptations, revisions, additions, and deletions may be made to the present invention without departing from the spirit and scope of the invention as claimed.

What is claimed is:

1. A method of constructing a wafer-on-wafer semiconductor package comprising:

providing a semiconductor device wafer having at least one active surface and an opposite surface, the semiconductor device wafer comprising a plurality of unsingulated semiconductor dies having die bond pads exposed on the at least one active surface of the semiconductor device wafer;

providing a support wafer having a die connect surface and a testing/mounting surface;

forming a plurality of vias arranged in a preselected pattern, the plurality of vias extending from the die connect surface of the support wafer to the testing/mounting surface of the support wafer;

disposing a plurality of electrically conductive traces on the die connect surface of the support wafer, the plurality of electrically conductive traces each having a prepositioned die bond pad connect element end and a via end terminating at one of the plurality of vias;

locating and forming a plurality of electrically conductive die bond pad connect elements on the die connect surface of the support wafer, the plurality of electrically conductive die bond pad connect elements each being in electrical communication with selected said die bond pad connect element ends of the plurality of electrically conductive traces;

introducing a volume of an electrically conductive material within at least some of the plurality of vias, the volume of the electrically conductive material completing an electrical path between selected said plurality of electrically conductive die bond pad connect elements respectively associated with the at least some of the plurality of vias and terminating in a first meniscus proximate the testing/mounting surface of the support wafer to provide a plurality of test connection/mounting elements; and attaching the plurality of electrically conductive die bond pad connect elements to the die bond pads to mechanically and electrically connect the semiconductor device wafer to the support wafer to create the wafer-on-wafer semiconductor package.

2. The method of claim 1, wherein forming the plurality of electrically conductive die bond pad connect elements comprises forming a plurality of electrically conductive globules of a preselected material.

3. The method of claim 1, wherein disposing the plurality of electrically conductive traces comprises disposing electrically conductive traces comprising copper.

4. The method of claim 3, wherein disposing the plurality of electrically conductive traces comprises disposing electrically conductive traces having a thickness not exceeding approximately 10 µm.

5. The method of claim 2, wherein forming the plurality of electrically conductive die bond pad connect elements comprises forming the plurality of electrically conductive globules from a preselected reflowable solder material.

6. The method of claim 2, wherein forming the plurality of electrically conductive globules comprises forming the plurality of electrically conductive globules of a material comprising at least one metal.

7. The method of claim 1, wherein attaching the plurality of electrically conductive die bond pad connect elements to the die bond pads comprises using controlled collapsed chip connection bonding techniques.

8. The method of claim 1, wherein forming the plurality of vias comprises forming the plurality of vias by at least one of the processes of the group consisting of etching, laser drilling, and electro-chemical anodization.

9. The method of claim 1, wherein introducing the volume of the electrically conductive material within the at least some of the plurality of vias comprises placing the support wafer in a bath of the electrically conductive material which has been heated to an elevated temperature.

10. The method of claim 9, wherein placing the support wafer in the bath of the electrically conductive material comprises floating the support wafer in the bath of the electrically conductive material and wherein the bath of the electrically conductive material comprises lead and tin.

11. The method of claim 1, wherein introducing the volume of the electrically conductive material within the at least some of the plurality of vias results in forming a second meniscus on the die connect surface of the support wafer in electrical communication with one of the plurality of electrically conductive traces respectively associated with the at least some of the plurality of vias.

12. The method of claim 1, further comprising disposing a thin film of metallic material comprising copper within the at least some of the plurality of vias.

13. The method of claim 12, wherein disposing the thin film of metallic material comprises disposing the thin film of metallic material by chemical vapor deposition.

14. The method of claim 1, further comprising providing a diffusion barrier within the at least some of the plurality of vias.

15. The method of claim 14, wherein providing the diffusion barrier comprises disposing the diffusion barrier within the at least some of the plurality of vias by chemical vapor deposition.

16. The method of claim 14, wherein providing the diffusion barrier within the at least some of the plurality of vias comprises forming a first layer of titanium oxide by chemical vapor deposition followed by forming a second layer over the first layer by chemical vapor deposition, the second layer comprising a thin film of copper.

17. The method of claim 14, wherein providing the diffusion barrier within the at least some of the plurality of vias comprises providing an oxide layer formed at a temperature exceeding approximately 1000° C.

18. The method of claim 14, wherein providing the diffusion barrier within the at least some of the plurality of vias comprises providing an oxide layer formed at a temperature not exceeding approximately 600° C.

19. The method of claim 1, wherein providing the support wafer comprises obtaining a defective semiconductor device wafer having at least one defect rendering it nonsuitable for use as the semiconductor device wafer and using the defective semiconductor device wafer as the support wafer.

20. The method of claim 19, wherein obtaining the defective semiconductor device wafer comprises obtaining the defective semiconductor device wafer from a same production line which produced the semiconductor device wafer.

21. The method of claim 1, wherein providing the support wafer and providing the semiconductor device wafer comprise providing a semiconductor device wafer and providing a support wafer in which both wafers are of essentially identical material and are of essentially a same size and configuration.

22. The method of claim 21, wherein providing the support wafer and providing the semiconductor device wafer comprise providing a semiconductor device wafer and providing a support wafer in which both wafers comprise at least one of the group consisting of silicon, germanium, silicon germanium, silicon carbide, gallium arsenide, selenium, and tellurium.

23. The method of claim 1, wherein providing the semiconductor device wafer comprises providing a semiconductor device wafer in which at least some of the plurality of unsingulated semiconductor dies each comprise ultra large-scale integration of active devices.

24. The method of claim 23, wherein providing the semiconductor device wafer comprises providing a semiconductor device wafer in which the at least some of the plurality of unsingulated semiconductor dies each comprise a quantity of active devices which exceeds approximately 100 million.

25. The method of claim 1, further comprising contacting at least some of the plurality of test connection/mounting elements of the wafer-on-wafer semiconductor package with correspondingly positioned test probes.

26. The method of claim 25, further comprising electrically exercising and testing the plurality of unsingulated semiconductor dies of the wafer-on-wafer semiconductor package at an elevated temperature.

27. The method of claim 26, further comprising actively removing heat from the opposite surface of the semiconductor device wafer when electrically exercising the plurality of unsingulated semiconductor dies of the wafer-on-wafer semiconductor package.

28. The method of claim 26, further comprising identifying unsingulated semiconductor dies of the wafer-on-wafer package which are not successfully exercised and tested.

29. A method of constructing a wafer-on-wafer semiconductor package having a semiconductor device wafer having at least one active surface and an opposed surface, the semiconductor wafer having a plurality of semiconductor dice thereon, each semiconductor die having bond pads, said method comprising:

provuding a support wafer having a die connect surface and a testing/mounting surface;

forming a plurality of vias arranged in a preselected pattern, the plurality of vias extending from the die connect surface of the support wafer to the testing/mounting surface of the support wafer;

disposing a plurality of electrically conductive traces on the die connect surface of the support wafer, the plurality of electrically conductive traces each having a prepositioned die bond pad connect element end and a via end terminating at one of the plurality of vias;

locating and forming a plurality of electrically conductive die bond pad connect elements on the die connect surface of the support wafer, the plurality of electrically conductive die bond pad connect elements each being in electrical communication with selected said die bond pad connect element ends of the plurality of electrically conductive traces;

introducing a volume of an electrically conductive material within at least some of the plurality of vias, the volume of the electrically conductive material completing an electrical path between selected said plurality of electrically conductive die bond pad connect elements respectively associated with the at least some of the plurality of vias and terminating in a first meniscus proximate the testing/mounting surface of the support wafer to provide a plurality of test connection/mounting elements; and attaching the plurality of electrically conductive die bond pad connect elements to the die bond pads to mechanically and electrically connect the semiconductor device wafer to the support wafer to create the wafer-on-wafer semiconductor package.

30. The method of claim 29, wherein forming the plurality of electrically conductive die bond pad connect elements comprises forming a plurality of electrically conductive globules of a preselected material.

31. The method of claim 29, wherein disposing the plurality of electrically conductive traces comprises disposing electrically conductive traces comprising copper.

32. The method of claim 31, wherein disposing the plurality of electrically conductive traces comprises disposing electrically conductive traces having a thickness not exceeding approximately 10 μm.

33. The method of claim 30, wherein forming the plurality of electrically conductive die bond pad connect elements comprises forming the plurality of electrically conductive globules from a preselected reflowable solder material.

34. The method of claim 30, wherein forming the plurality of electrically conductive globules comprises forming the plurality of electrically conductive globules of a material comprising at least one metal.

35. The method of claim 29, wherein attaching the plurality of electrically conductive die bond pad connect elements to the die bond pads comprises using controlled collapsed chip connection bonding techniques.

36. The method of claim 29, wherein forming the plurality of vias comprises forming the plurality of vias by at least one of the processes of the group consisting of etching, laser drilling, and electrochemical anodization.

37. The method of claim 29, wherein introducing the volume of the electrically conductive material within the at least some of the plurality of vias comprises placing the support wafer in a bath of the electrically conductive material which has been heated to an elevated temperature.

38. The method of claim 37, wherein placing the support wafer in the bath of the electrically conductive material comprises floating the support wafer in the bath of the electrically conductive material and wherein the bath of the electrically conductive material comprises lead and tin.

39. The method of claim 29, wherein introducing the volume of the electrically conductive material within the at least some of the plurality of vias results in forming a second meniscus on the die connect surface of the support wafer in electrical communication with one of the plurality of electrically conductive traces respectively associated with the at least some of the plurality of vias.

40. The method of claim 29, further comprising disposing a thin film of metallic material comprising copper within the at least some of the plurality of vias.

41. The method of claim 40, wherein disposing the thin film of metallic material comprises disposing the thin film of metallic material by chemical vapor deposition.

42. The method of claim 29, further comprising providing a diffusion barrier within the at least some of the plurality of vias.

43. The method of claim 42, wherein providing the diffusion barrier comprises disposing the diffusion barrier within the at least some of the plurality of vias by chemical vapor deposition.

44. The method of claim 42, wherein providing the diffusion barrier within the at least some of the plurality of vias comprises forming a first layer of titanium oxide by chemical vapor deposition followed by forming a second layer over the first layer by chemical vapor deposition, the second layer comprising a thin film of copper.

45. The method of claim 42, wherein providing the diffusion barrier within the at least some of the plurality of vias comprises providing an oxide layer formed at a temperature exceeding approximately 1000° C.

46. The method of claim 42, wherein providing the diffusion barrier within the at least some of the plurality of vias comprises providing an oxide layer formed at a temperature not exceeding approximately 600° C.

47. The method of claim 29, wherein providing the support wafer comprises obtaining a defective semiconductor device wafer having at least one defect rendering it nonsuitable for use as the semiconductor device wafer and using the defective semiconductor device wafer as the support wafer.

48. The method of claim 47, wherein obtaining the defective semiconductor device wafer comprises obtaining the defective semiconductor device wafer from a same production line which produced the semiconductor device wafer.

49. The method of claim 29, wherein providing the support wafer and providing the semiconductor device wafer comprise providing a semiconductor device wafer and providing a support wafer in which both wafers are of essentially identical material and are of essentially a same size and configuration.

50. The method of claim 49, wherein providing the support wafer and providing the semiconductor device wafer comprise providing a semiconductor device wafer and providing a support wafer in which both wafers comprise at least one of the group consisting of silicon, germanium, silicon germanium, silicon carbide, gallium arsenide, selenium, and tellurium.

51. The method of claim 29, wherein providing the semiconductor device wafer comprises providing a semiconductor device wafer in which at least some of the plurality of unsingulated semiconductor dies each comprise ultralarge-scale integration of active devices.

52. The method of claim 51, wherein providing the semiconductor device wafer comprises providing a semiconductor device wafer in which the at least some of the plurality of unsingulated semiconductor dies each comprise a quantity of active devices which exceeds approximately 100 million.

53. The method of claim 29, further comprising contacting at least some of the plurality of test connection/mounting elements of the wafer-on-wafer semiconductor package with correspondingly positioned test probes.

54. The method of claim 53, further comprising electrically exercising and testing the plurality of unsingulated semiconductor dies of the wafer-on-wafer semiconductor package at an elevated temperature.

55. The method of claim 54, further comprising actively removing heat from the opposed surface of the semiconductor device wafer when electrically exercising the plurality of unsingulated semiconductor dies of the wafer-on-wafer semiconductor package.

56. The method of claim 54, further comprising identifying unsingulated semiconductor dies of the wafer-on-wafer package which are not successfully exercised and tested.

* * * * *

UNITED STATES PATENT AND TRADEMARK OFFICE
CERTIFICATE OF CORRECTION

PATENT NO. : 6,653,208 B2
DATED : November 25, 2003
INVENTOR(S) : Kie Y. Ahn and Leonard Forbes It is certified that error appears in the above-identified patent and that said Letters Patent is hereby corrected as shown below:

Title page,
Item [56], References Cited, OTHER PUBLICATIONS, "Krishnamoorthy et al.," reference, change "0.8βm" to -- 0.8μm --

Column 11,
Line 55, change "1," to -- 11, --

Column 13,
Line 18, before "the" delete "a"

Column 18,
Line 51, change "ultra large-" to -- ultralarge- --

Column 20,
Line 6, change "electrochemical" to -- electro-chemical --

Signed and Sealed this

Fourth Day of January, 2005

JON W. DUDAS
*Director of the United States Patent and Trademark Office*